United States Patent

Scheerer et al.

Patent Number: 5,804,978
Date of Patent: Sep. 8, 1998

[54] CIRCUIT FOR FEEDING A WHEATSTONE BRIDGE WITH A RECTANGULAR WAVEFORM VOLTAGE

[76] Inventors: Joachim Scheerer, Am Fort Weisenau 38; Hartmut Gruetzediek, An Der Klosterheck 16, both of D-55130 Mainz, Germany

[21] Appl. No.: 624,840

[22] Filed: Mar. 22, 1996

[30] Foreign Application Priority Data

Mar. 22, 1995 [DE] Germany .................. 195 09 815.3

[51] Int. Cl.$^6$ ............................................... G01R 27/08
[52] U.S. Cl. ............................................ 324/706; 324/610
[58] Field of Search .................... 324/706, 720, 324/725, 610, 252; 330/146

[56] References Cited

U.S. PATENT DOCUMENTS

| | | | |
|---|---|---|---|
| 3,873,917 | 3/1975 | Kreuzer | 324/706 |
| 4,596,950 | 6/1986 | Lienhard | 324/252 |

*Primary Examiner*—Christine K. Oda
*Attorney, Agent, or Firm*—Helfgott & Karas, PC

[57] ABSTRACT

The circuit for feeding a Wheatstone Bridge (DMS 1 ... DMS 4) with a rectangular waveform alternating voltage which is derived from a single DC reference voltage, consists of a first operational amplifier (V 1) whose positive input is connected to the DC reference voltage and whose negative input is connected via the switches (S 5 and S 6) alternately to the one (A) or to the other (B) feed point of the bridge, and a second operational amplifier (V 2) whose positive input is connected to ground potential and whose negative input is connected to one measuring input (C) of the bridge. The outputs of the two operational amplifiers (V 1 and V 2) are connected via the switches (S 1 ... S 4) alternately to the one (A) and to the other (B) feed point of the bridge, and the output signal is taken off at the second measuring output (D) of the bridge. This circuit gives a very stable rectangular waveform alternating voltage with steep switching flanks without roof slope and uses only monolithically integratable components.

17 Claims, 6 Drawing Sheets

5,804,978

CIRCUIT FOR FEEDING A WHEATSTONE BRIDGE WITH A RECTANGULAR WAVEFORM VOLTAGE

BACKGROUND OF THE INVENTION

1. Field of the Invention

This invention is concerned with a circuit for feeding a Wheatstone Bridge with a rectangular waveform voltage which is derived from a single reference voltage.

2. Description of the Related Art

Wheatstone Bridges are well known. They consist of four resistors which all have the same resistance value in the balanced state. The four resistors are connected in series in a closed loop with four junctions and the excitation voltage is connected between two opposite junctions. The output voltage, which is zero in the balanced state, is taken off between the other two junctions. Wheatstone Bridges are used, for example, in transmitters with strain gauges (SG) whereby the four SG constitute the four resistors of the bridge and two of these SG are stretched while the other two are compressed, and the output signal of the bridge is proportional to the resistance change of the SG.

Feeding the Wheatstone Bridge with an alternating voltage has the advantage that thermoelectric voltages arising in the bridge circuit do not falsify the measurement result and, furthermore, it is easier to build low-noise alternating voltage amplifiers to amplify the small output voltages of the bridge than it is to build low-noise direct voltage amplifiers.

A circuit for feeding a Wheatstone Bridge with a rectangular waveform voltage which is derived from a single DC reference voltage is known from the French patent No. 2 670 901. There two capacitors are charged to the same voltage and than separated and grounded on different sides so that two DC voltages symmetrical with respect to ground potential are produced (so-called voltage mirror). If the grounding is changed in alternate clock cycles, a rectangular waveform voltage symmetrical with respect to ground potential is produced for feeding the bridge. However, because capacitors are used for charge transfer, the current loading capability of this alternating voltage source is very small and roof slope appears in the rectangular waveform. Furthermore, large peak currents appear if charging of the capacitors is to take place in a short time in order to keep the gaps in the rectangular waveform alternating voltage small.

Also in the EP 141 080 a circuit is specified as state of technology, in which a single direct voltage source is connected with alternating polarity via switches to a transformer, so that a rectangular alternating voltage waveform is available on the secondary side of the transformer. Roof slope appears here too in the rectangular waveform alternating voltage and implementation effort is comparatively large because transformers cannot be integrated and therefore constitute a foreign body in most circuits. Furthermore it is known from this EP 141 080 that two direct voltages which are symmetrical with respect to ground potential can be used to produce a rectangular waveform alternating voltage via commutating switches for feeding the Wheatstone Bridge. However, this circuit requires two direct voltages with opposite polarity which must be of equal magnitude within the scope of the required accuracy, and this condition entails corresponding effort.

In all three cited known circuits the resistance values of the connecting leads and to a certain extent also the resistance values of the switches falsify the magnitude of the excitation voltage which actually reaches the bridge.

For Wheatstone Bridges which are fed with direct voltage an arrangement is also known in which one feed point of the bridge is, for example, connected to a positive direct voltage and the negative direct voltage for the other feed point is produced by a loop control amplifier (operational amplifier) which holds one measuring output of the bridge virtually at ground potential) shown for example in the DE-PS 31 42 325 or in the book Tietze/Schenk: Semiconductor Circuit Technology, 9th issue 1991, page 915/FIGS. 26, 39). If one tries to transpose this circuit for alternating voltage excitation with a rectangular waveform voltage, it would be necessary to produce a very stable rectangular waveform alternating voltage for the one feed point, and the relatively slow slew rate of the operational amplifier would produce only a small slope flank of the rectangular waveform alternating voltage at the second feed point and therefore a relatively long time during which the output signal of the bridge is falsified by transient effects.

SUMMARY OF THE INVENTION

Thus the task of this invention is to specify a circuit for feeding a Wheatstone Bridge with a rectangular waveform alternating voltage which is derived from only a single DC reference voltage and which consists of simple monolithically integratable components, has a short transient response on the flanks of the rectangular waveform alternating voltage and permits compensation for the resistance of the connecting leads to the bridge. In addition thereto a circuit is to be specified with the help of which an analog to digital converter and possibly also a digital filter can be connected to the bridge such that the commutating frequency of the switches is particularly strongly suppressed and also with their aid non-linearities can be compensated.

According to this invention this is achieved in the first realization form, in that the circuit contains a first operational amplifier whose positive input is connected to the DC reference voltage and whose negative input is connected via switches alternately to the one or to the other feed point of the bridge, and in that the circuit contains a second operational amplifier whose positive input is connected to ground potential and whose negative input is connected to one measuring output of the bridge, and in that the outputs of the two operational amplifiers are alternately connected via switches to the one or to the other fed point of the bridge and in that the output signal is taken off at the second measuring output of the bridge.

In a second realization form the task of the invention is solved in that the circuit between the two feed points of the bridge contains two equal fixed resistors connected in series and in that the circuit contains a first operational amplifier whose positive input is connected to the DC reference voltage and whose negative input is connected via switches alternately to the one or to the other feed point of the bridge, and in that the circuit contains a second operational amplifier whose positive input is connected to ground potential and whose negative input is connected to the junction of the two fixed resistors, and in that the outputs of the two operational amplifiers are alternately connected via switches to the one or to the other feed point of the bridge and in that the output signal of the bridge is taken off at the two output points of the bridge.

Through the exclusive use of amplifiers and analog switches the circuit consists of standard components and is easily integratable. On account of the polarity changing switches at the output of the operational amplifiers, the operational amplifiers are required to deliver almost no output voltage swing so that transient processes are completed very quickly. Through the use of operational amplifiers as voltage sources, variations of the connecting lead resistances are compensated, because the return lines can be connected directly to the bridge and these return lines together with the switches contained therein are carrying almost no current. Through the virtual grounding of one measuring output in the first implementation form, the output signal at the second measuring output can be taken off unbalanced with respect to ground without requiring an additional bias voltage, thus simplifying the construction of the measuring amplifier for the output signal.

BRIEF DESCRIPTION OF THE DRAWING

Useful implementations result from the subsidiary claims.

The invention is described below with reference to the schematic drawings which show.

DETAILED DESCRIPTION

Figure 1:
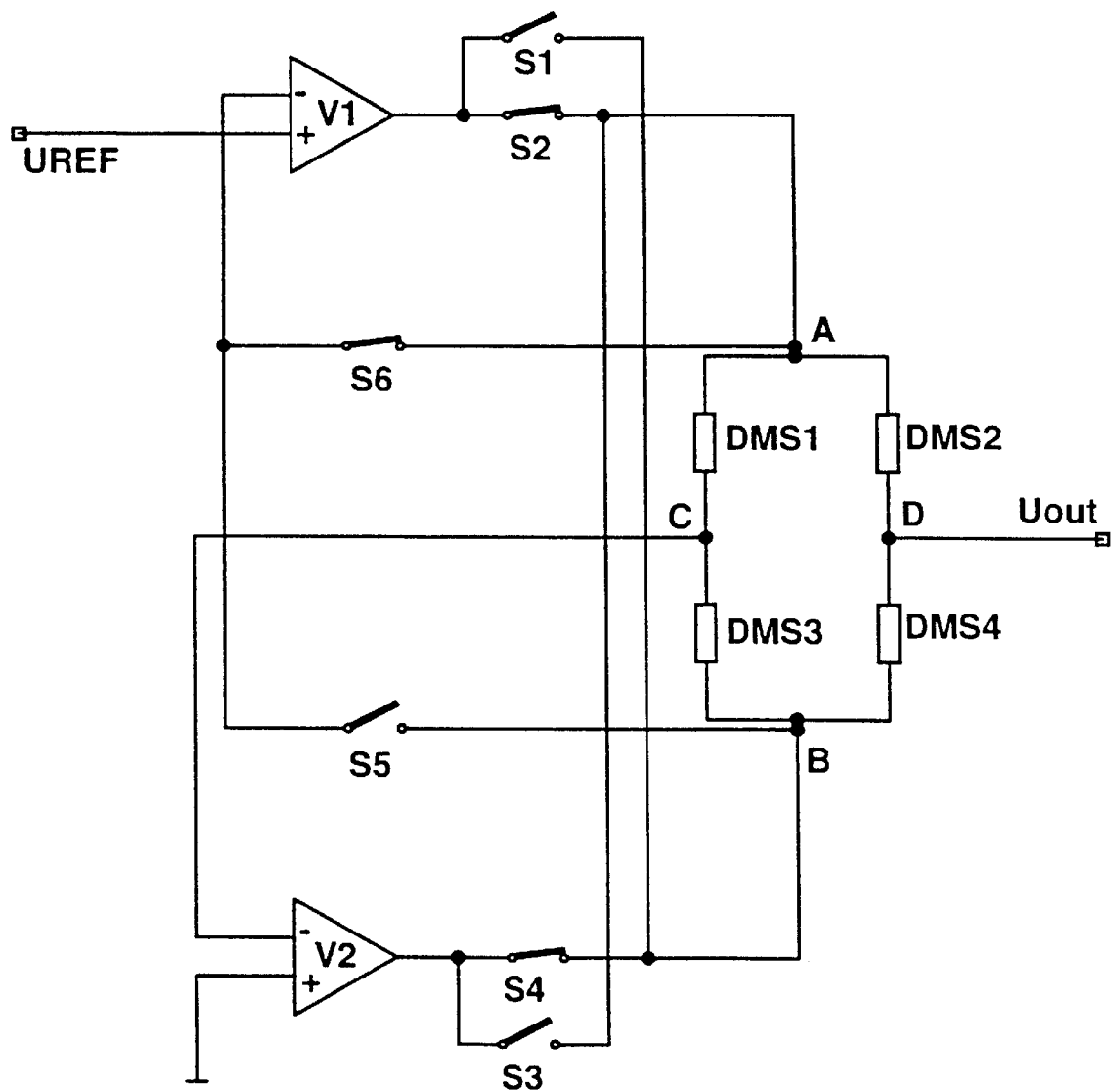
FIG. 1 A first implementation of the circuit according to this invention.

The simplest version of the circuit according to this invention is shown in FIG. 1. The Wheatstone Bridge consists of the resistors DMS 1, DMS 2, DMS 3 and DMS 4 which in the non-stressed state of the transmitter all have the same resistance value. The feed points of the bridge are A and B, and the output signal can be taken off between the points C and D, whereby on account of the virtual grounding of point C the output signal can be taken off at point D alone as alternating voltage with respect to ground.

The point A of the bridge in the setting of the switches shown in FIG. 1 receives the output voltage of the operational amplifier V 1 via the closed switch S 2. The positive input f the operational amplifier V 1 is connected to the (assumed positive)n) reference voltage $U_{ref}$ and the negative input is connected via the closed switch S 6 to the point A of the bridge. This makes the operational amplifier V 1 always adjust its output voltage such that exactly the reference voltage appears at point A, irrespective of the series resistance of the switch S 2 and irrespective of the resistance of the connecting lead between the operational amplifier V 1 and the point A. Because the input of the operational amplifier V 1 has very high impedance, no current flows through the switch S 6 and the connecting leads, so that any resistance changes in the return line do not affect the magnitude of the voltage at point A of the bridge.

In the setting of the switches shown in FIG. 1 the point B of the bridge receives the output voltage of the operational amplifier V 2 via the closed switch S 4. The positive input of the operational amplifier V 2 is grounded and the negative input is connected to point C of the bridge. Consequently the operational amplifier V 2 adjusts its output voltage such that potential zero appears at point C of the bridge. When the bridge is balanced, i.e. when all four resistors DMS 1 . . . DMS 4 have the same resistance value, exactly the negative reference voltage appears at point B. The series resistance of the switch S 4 and the connecting lead resistance up to point B of the bridge do not affect the bridge feed voltage at point B, similarly the connecting lead from point C of the bridge to the input of the operational amplifier V 2 is uncritical because no current is flowing there.

An oscillator omitted in FIG. 1 for simplicity (or, in general, a clock timebase) makes the switches S 1 . . . S 6 switch over at fixed time intervals, e.g. a few milliseconds, whereby all switches shown closed in FIG. 1 open and all switches shown open in FIG. 1 close. This connects the output voltage of the operational amplifier V 1 via the switch S 1 to point B of the bridge and similarly the return line to the negative input of the operational amplifier V 1 via the switch S 5 to point B of the bridge, so that virtually nothing changes in the operating point of the operational amplifier V 1—except for the small difference caused by different switch and connecting lead resistances. The output voltage of the operational amplifier V 2 is connected in the new switch setting via the switch S 3 to point A of the bridge. Also virtually nothing changes in the operating point of the operational amplifier V 2. The slight difference of the same polarity voltages between points A and B on comparing two successive states of the analog switches has the consequence that the operational amplifiers V 1 and V 2 only have to make a very small voltage excursion of the order of a few mV on each switchover. This value, however, is of the same order of magnitude as the voltage swing necessary anyway die to the resistance values of the switches S 1 . . . S 4 and the connecting leads to the bridge.

So altogether the described circuit produces very exact equality of the positive and negative feed voltages of the bridge and very fast switchover and thus very steep switching flanks of the rectangular alternating voltage.

So far the explanation of the circuit has assumed that the Wheatstone Bridge is balanced, i.e. that all four resistors DMS 1 . . . DMS 4 have exactly the same resistance value. This corresponds to the non-stressed state of the transmitter containing the strain gauges. When the transmitter is now loaded mechanically, the resistance of DMS 1 and DMS 4 increases, and the resistance of DMS 2 and DMS 3 decreases. Consequently the voltage division ration of the bridge branch ACB changes slightly and the voltage at point B is no longer exactly opposite to the voltage at point A. Calculating this effect in detail, it is found that the output voltage characteristic of the bridge has a slight curvature, but this effect is smaller that with direct voltage bridge excitation because of the commutation. The linearity of the characteristic can be restored by the circuit according to FIG. 5 or by calculation in the following analog to digital converter.

If instead of a full bridge, in which the values of all four bridge resistor change, a so-called half bridge is used in which the resistances in only one bridge branch change and the second bridge branch consists of fixed resistors, it is appropriate to implement the bridge branch ACB in FIG. 1 with fixed resistors and to use active resistors for the other branch ADB. The linearity then remains unaffected.

Details of the circuit, e.g. backing capacitors, have been omitted in FIG. 1 for simplicity because they are known to every trained technician. Similarly any trained technician can devise the details for driving the switches S 2 . . . S 6, e.g. it is necessary to ensure that the switches S 2 and S 4 open before the switches S 1 and S 3 close, etc. The switches shown in FIG. 1 as mechanical switches can of course be implemented as FET switches in a preferred implementation, in order to achieve higher switching frequencies and monolithic integration to avoid wear-out.

Figure 2:
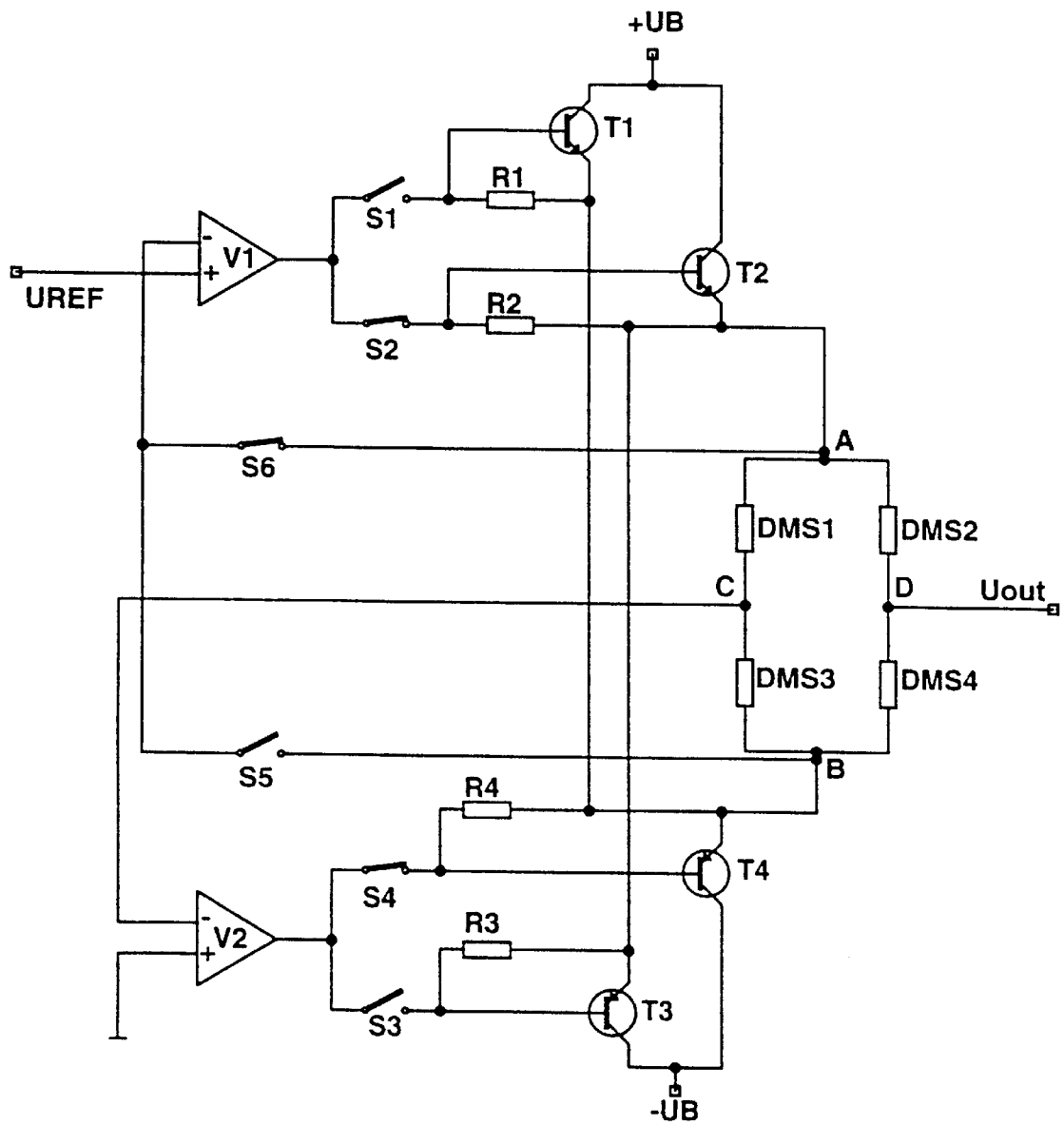
FIG. 2 An extended second implementation of the circuit according to this invention.

The circuit shown in FIG. 2 is extended relative to the circuit in FIG. 1 by one transistor T 1 . . . T 4 as emitter follower beyond each of the switches S 1 . . . S 4. These transistors operate as impedance changers and reduce the loading of the outputs of the operational amplifiers V 1 and V 2 and divert the full current required for feeding the Wheatstone Bridge away from the switches S 1 . . . S 4. The transistors T 1 . . . T 4 are bipolar transistors in emitter follower circuit and thus very fast so that they produce no significant delay of the rising flank of the rectangular waveform output voltage. The voltage displacement due to the transistors T 1 . . . T 4 does not cause disturbance because it is canceled by the operational amplifiers V 1 and V 2 just like a voltage drop on the connecting leads to the bridge. Barrier layer FETs or MOSFETs or other controllable voltage or current sources can be used instead of bipolar transistors for T 1 . . . T 4. The further parts of the circuit in FIG. 2 correspond to the circuit in FIG. 1 and are marked with the same reference symbols so that they need not be explained again.

Figure 3:
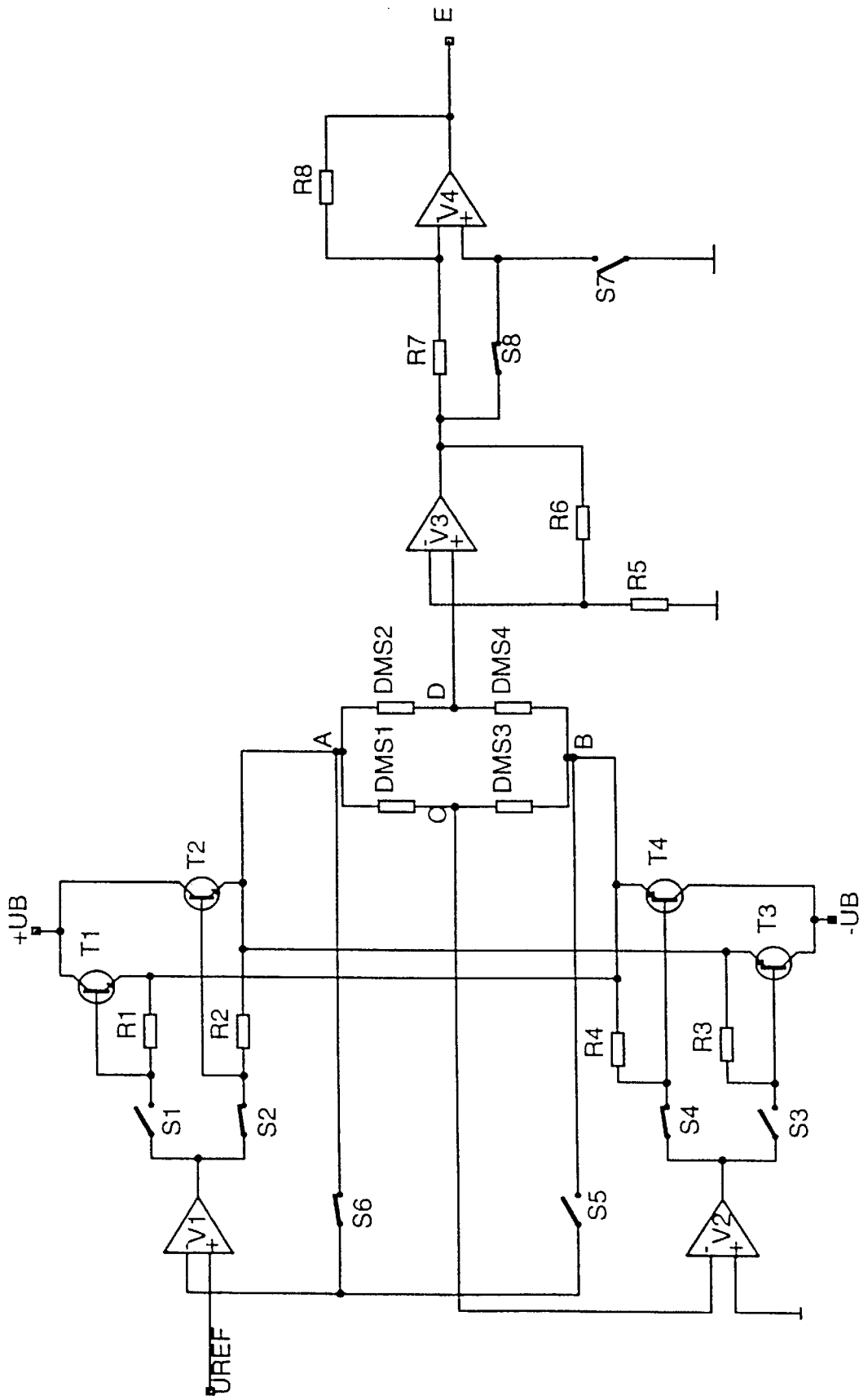
FIG. 3 The implementation according to FIG. 2 extended with an amplifier and demodulator circuit.

In FIG. 3 the same circuit is shown again and extended with the evaluating circuit for evaluating the output signal at output D of the Wheatstone Bridge. The first part of the evaluating circuit consists of an amplifier. Its gain is given by the quotient (R 5+R 6)/R 5. The second part of the evaluating circuit is a demodulator which converts the rectangular waveform alternating voltage back to a direct voltage, In the settings of the switches S 7 and S 8 as shown the operational amplifier V 4 operates as voltage follower, i.e. with gain +1. In the other setting of the switches S 7 and S 8, with switch S 7 closed and switch S 8 open, the operational amplifier V 4 operates as inverting amplifier with gain factor determined by the feedback resistors R 7 and R 8. If R 7 is made equal to R 8, the gain factor becomes exactly −1. The switches S 7 and S 8 are switched synchronously with the switches S 1 . . . S 6 whereby in this implementation form in one clock period all switches with odd numbers are open and all switches with even numbers are closed (as drawn) and in the next clock period all switches with odd numbers are closed and all switches with even numbers are open. So the demodulator produces again a direct voltage signal from the alternating voltage output signal of the bridge. By virtue of the steep switching flanks of the circuit according to this invention, the switching transient disturbances remaining in the output signal at point E are so brief that normally a low-pass filter connected on the output side suffices to suppress them adequately.

Figure 4:
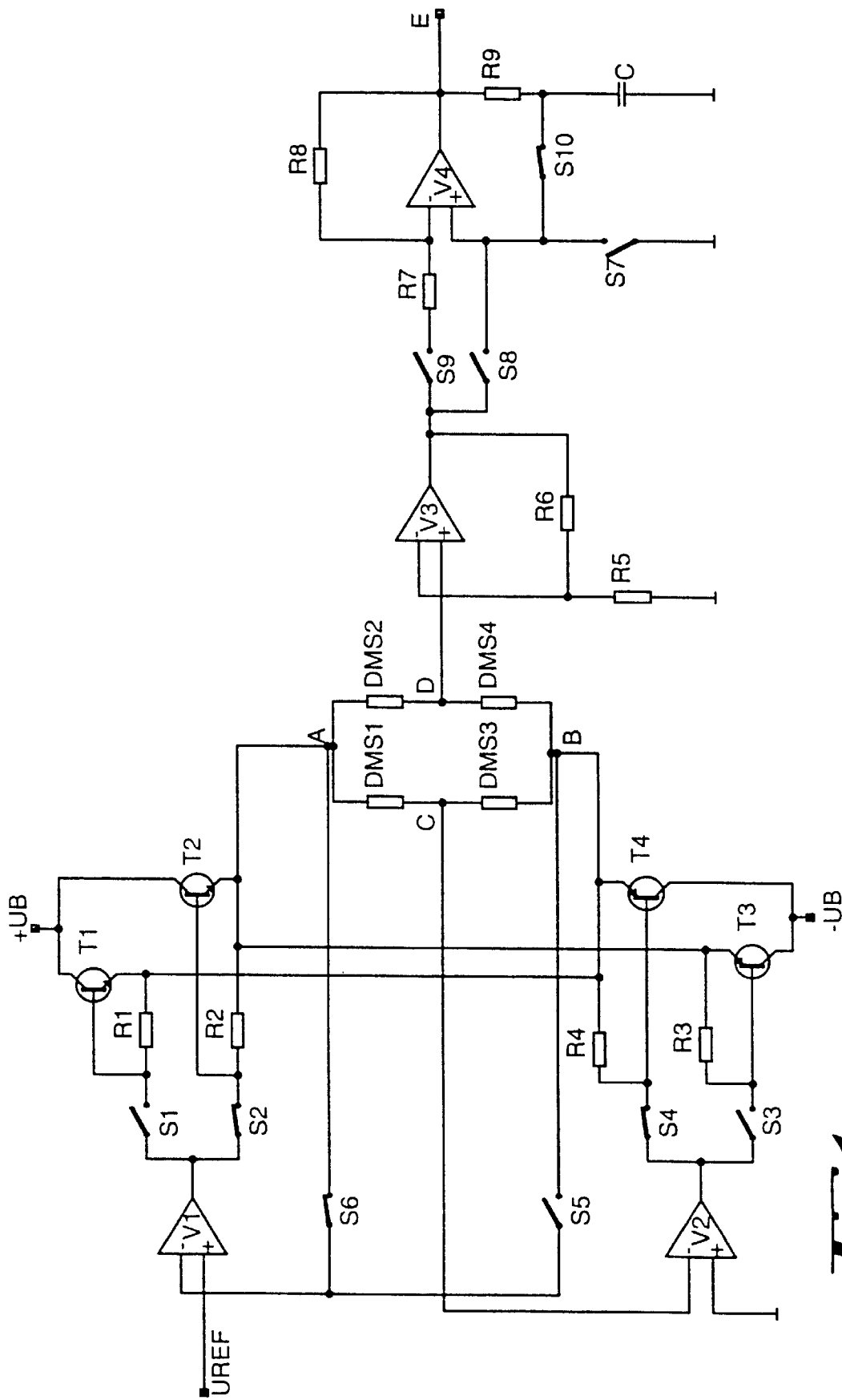
FIG. 4 A variation on the circuit in FIG. 3.

However, FIG. 4 shows a supplemented circuit in which the switching flank disturbances are suppressed even more strongly: The two switches S 7 and S 8 close in this circuit in each case only after completion of the transient response of the bridge. During the transient response, which typically lasts for a few microseconds and is shown in FIG. 4, the two switches S 7 and S 8 are open, as well as The switch S 9. During this time the operational amplifier V 4 is held at its old output level by the closed switch S 10 and the capacitor C. After completion of the transient response the switch S 9 closes and one of the two switches S 7 or S 8 as well as the switch S 10 open. The circuit then functions exactly the same as already described for the circuit according to FIG. 3.

Figure 5:
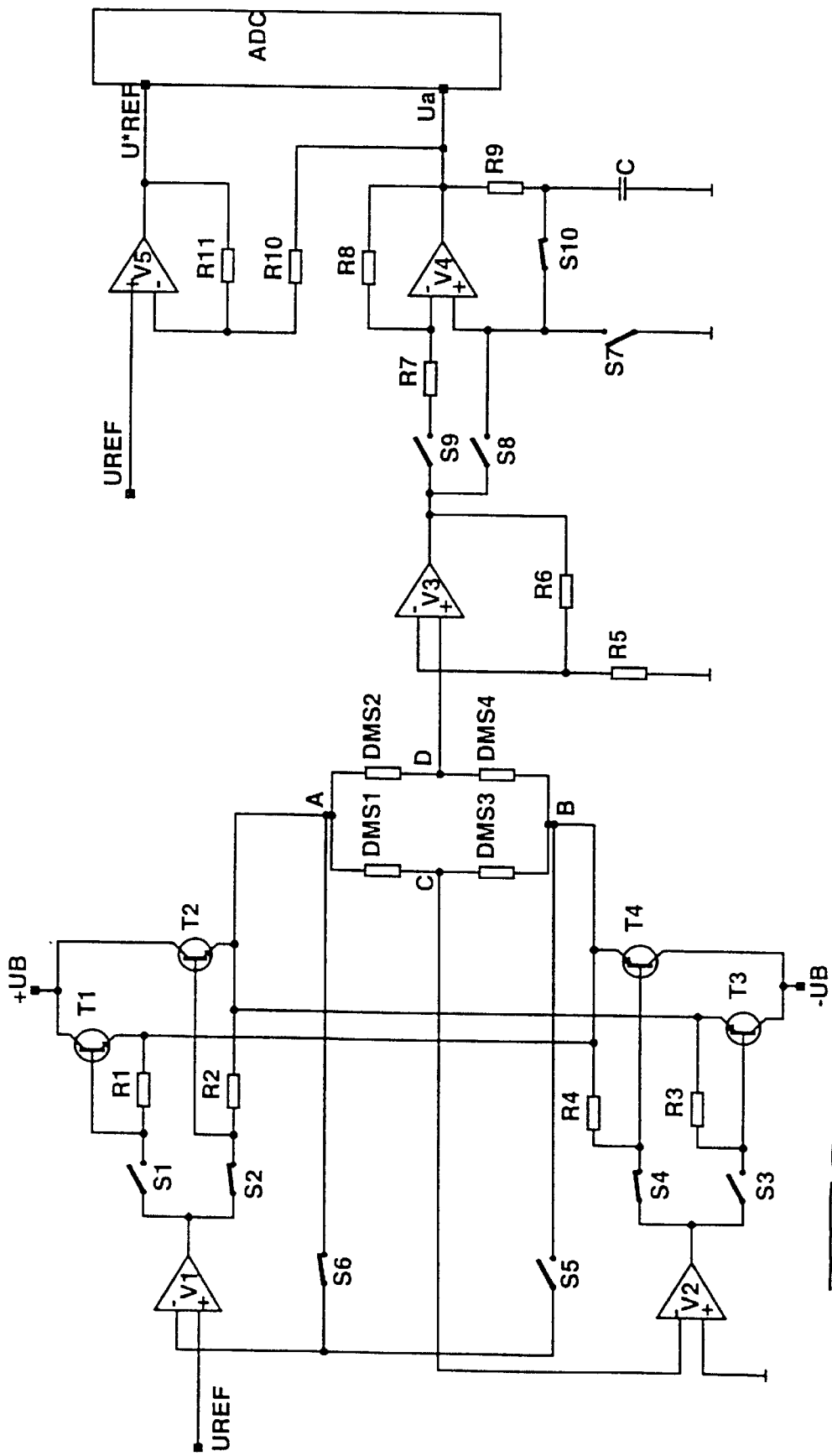
FIG. 5 Another variation on the circuit in FIG. 3

In FIG. 5 the evaluating circuit according to FIG. 4 is extended with an analog to digital converter ADC. The reference voltage $U^*_{ref}$ for the analog to digital converter is thereby derived from the reference voltage $U_{ref}$ for feeding the Wheatstone Bridge circuit, in order to achieve independence of the digitized result from the magnitude of the reference voltage in the known manner. In addition thereto FIG. 5 shows a possibility for linearisation: The operational amplifier V 5 and the resistors R 10 and R 11 slightly modify the reference voltage $U^*_{Ref}$ by the measuring output voltage $U_a$. The analog to digital converter forms the ratio of the voltages $U_a$ and $U^*_{Ref}$, so a slight curvature of the characteristic is produced which can be dimensioned such as to compensate for the non-linearity of the output signal. The non-linearity of the output signal can be caused as described above by slight changes of the alternating feed voltage with unbalance of the bridge, or it may be due to the mechanical non-linearity of the transmitter containing the strain gauges or it may be due to the characteristic of the strain gauges themselves. If linearization is not necessary, R 10 is made infinitely large and the operational amplifier V 5 can generally be omitted.

If the output signal of the demodulated bridge circuit can take positive or negative sign during operation, it is of course possible to add to this output signal a constant offset voltage in order to obtain a unipolar input signal U for the analog to digital converter. The same can be achieved by adding a constant amplitude rectangular waveform voltage ahead of the demodulator.

The timing control for the analog to digital converter ADC is best derived from the same timebase which also controls the switches S 1 . . . S 9. In this manner the sampling rate (preferably integrating and containing no measuring gaps) of the analog to digital converter can be made an integer multiple or fraction of the commutation rate of the switches so that the commutation frequency of the switches is suppressed particularly strongly. In corresponding manner, the poles of the frequency response of a subsequent digital filter can be synchronized to the commutation frequency and its harmonics Almost ideal suppression of the commutation frequency is possible in this manner.

Figure 6:
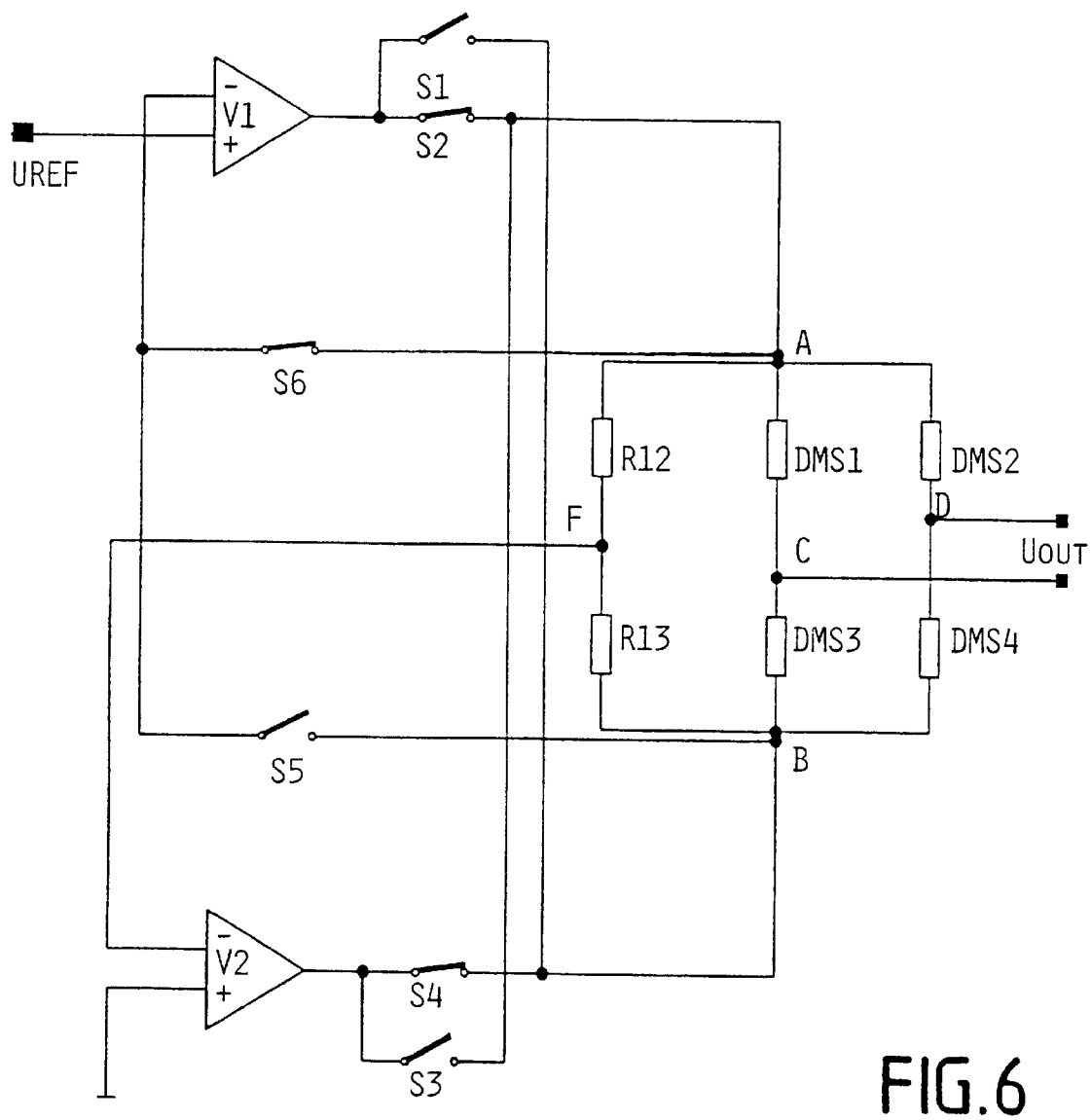
FIG. 6 A third implementation of the circuit according to this invention.

FIG. 6 shows a third implementation of the circuit according to this invention. Compared with the implementation according to FIG. 1, two additional fixed resistors R 12 and R 13 are here connected in parallel to the bridge circuit DMS 1 . . . DMS 4. The center point F of these two fixed resistors is virtually grounded by the operational amplifier V 2 so that the feed voltages at the points A and B are exactly equal and opposite irrespective of any resistance changes of the strain gauges. The output signal of the bridge circuit is taken of in the normal known manner at the points C and D. In this implementation form non-linearities resulting from the feed voltage supply for the bridge are avoided, but this requires additional effort for the two fixed resistors and additional effort for the alternating voltage amplifier whose input must be designed as floating differential amplifier.

What is claimed is:

1. Circuit for feeding a Wheatstone bridge (DMS 1 . . . DMS 4) with a rectangular waveform alternating voltage which is derived from a single DC reference voltage, characterized by the features that the circuit contains a first operational amplifier (V 1) whose sensitive input is connected to the DC reference voltage and whose negative input is connected via a first set of switches (S 5 and S 6) alternately to the one (A) or to another (B) feed point of the bridge, and that the circuit contains a second operational amplifier (V 2) whose positive input is connected to ground potential and whose negative input is connected to a voltage which is derived from the voltages of the two feed points (A and B) via resistive voltage division, and that the outputs of the two operational amplifiers (V 1 and V 2) are connected via a second set of switches (S 1 . . . S 4) alternately to the one (A) or to another (B) feed point of the bridge.

2. Circuit according to claim 1, characterized by the features that the resistive voltage division of the voltages of the two feed points (A and B) is being done by two fixed resistors (R 12, R 13), their junction (F) giving the voltage of the negative input of the second operational amplifier (V 2), and that the output signal of the bridge is taken off at two points (C) and (D).

3. Circuit according to claim 1, characterized by the features that the resistive voltage division of the voltages of the two feed points (A and B) is being done by two resistors (DMS1, DMS3) of the Wheatstone Bridge, their junction (C) giving the voltage of the negative input of the second operational amplifier (V 2), and that the output signal of the bridge is taken off at a measuring output (D) of the bridge.

4. Circuit according to claim 2, characterized by the feature that impedance converters, comprising transistors (T 1 . . . T 4), e.g. in emitter follower circuit, are connected between the second set of switches (S 1 . . . S 4) and the feed points (A and B) of the bridge.

5. Circuit according to claim 4, characterized by the feature that the output signal of the bridge is applied to a demodulator whose gain factor sign is switched synchronously with respect to the first and second set of switches (S 1 . . . S 6).

6. Circuit according to claim 5, characterized by the feature that the demodulator is commutated such that the transient response of the alternating voltage for feeding the bridge and the transient response of an alternating voltage amplifier interposed ahead of the demodulator, are suppressed.

7. Circuit according to claim 2, characterized by the feature that FET switches are used for the first and second set of switches and a third set of switches (S1 . . . S 8).

8. Circuit according to claim 2, characterized by the feature that the reference voltage (U*Ref) of a subsequent analog to digital converter (ADC) is derived from the same DC reference voltage from which also the rectangular waveform alternating voltage for feeding the bridge is derived.

9. Circuit according to claim 8, characterized by the feature that the reference voltage (U*Ref) of said subsequent analog to digital converter (ADC) is additionally slightly modified with a measuring signal voltage (Ua).

10. Circuit according to claim 2, characterized by the feature that the sampling rate of a subsequent integrating analog to digital converter (ADC) is an integer multiple or fraction of the communication frequency of the first and second set of switches and a third set of switches (S 1 . . . S 8).

11. Circuit according to claim 3, characterized by the feature that impedance converters, comprising transistors (T 1 . . . T 4), in emitter follower circuit, are connected between the first and second set of switches (S 1 . . . S 4) and the feed points (A and B) of the bridge.

12. Circuit according to claim 11, characterized by the feature that the output signal of the bridge is applied to a demodulator whose gain factor sign is switched synchronously with respect to the switches (S 1 . . . S 6).

13. Circuit according to claim 12, characterized by the feature that the demodulator is commutated such that the transient response of the alternating voltage for feeding the bridge and the transient response of an alternating voltage amplifier interposed ahead of the demodulator, are suppressed.

14. Circuit according to claim 3, characterized by the feature that FET switches are used for the first and second set of switches and a third set of switches (S 1 . . . S 8).

15. Circuit according to claim 3, characterized by the feature that the reference voltage (U*Ref) of a subsequent analog to digital converter (ADC) is derived from the same DC reference voltage from which also the rectangular waveform alternating voltage for feeding the bridge is derived.

16. Circuit according to claim 15, characterized by the feature that the reference voltage (U*Ref) of said subsequent analog to digital converter (ADC) is additionally slightly modified with a measuring signal voltage (Ua).

17. Circuit according to claim 3, characterized by the feature that the sampling rate of a subsequent integrating analog to digital converter (ADC) is an integer multiple or fraction of the communication frequency of the first and second set of switches and a third set of switches (S 1 . . . S 8).

* * * * *